US011227108B2

(12) United States Patent
Min et al.

(10) Patent No.: US 11,227,108 B2
(45) Date of Patent: *Jan. 18, 2022

(54) CONVOLUTIONAL NEURAL NETWORK ARCHITECTURE WITH ADAPTIVE FILTERS

(71) Applicant: NEC Laboratories America, Inc., Princeton, NJ (US)

(72) Inventors: Renqiang Min, Princeton, NJ (US); Dinghan Shen, Durham, NC (US); Yitong Li, Durham, NC (US)

(73) Assignee: NEC Corporation

( * ) Notice: Subject to any disclaimer, the term of this patent is extended or adjusted under 35 U.S.C. 154(b) by 684 days.

This patent is subject to a terminal disclaimer.

(21) Appl. No.: 16/038,830

(22) Filed: Jul. 18, 2018

(65) Prior Publication Data
US 2019/0079915 A1 Mar. 14, 2019

Related U.S. Application Data

(60) Provisional application No. 62/556,534, filed on Sep. 11, 2017.

(51) Int. Cl.
*G06N 3/04* (2006.01)
*G06N 5/04* (2006.01)
(Continued)

(52) U.S. Cl.
CPC ............ *G06F 40/20* (2020.01); *G06F 16/335* (2019.01); *G06F 16/3329* (2019.01);
(Continued)

(58) Field of Classification Search
CPC .... G06F 17/27; G06F 17/30; G06F 17/30654; G06F 17/3069; G06F 17/30705;
(Continued)

(56) References Cited

U.S. PATENT DOCUMENTS 10,635,858 B2 * 4/2020 Min ................... G06N 5/046
2006/0095521 A1 * 5/2006 Patinkin ................ H04L 51/12
709/206

(Continued)

OTHER PUBLICATIONS

Chen, Yubo, et al. "Event extraction via dynamic multi-pooling convolutional neural networks." Proceedings of the 53rd Annual Meeting of the Association for Computational Linguistics and the 7th International Joint Conference on Natural Language Processing (vol. 1: Long Papers). 2015: 167-176 (Year: 2015).*

(Continued)

*Primary Examiner* — Kamran Afshar
*Assistant Examiner* — Randall K. Baldwin
(74) *Attorney, Agent, or Firm* — Joseph Kolodka

(57) ABSTRACT

A computer-implemented method for employing input-conditioned filters to perform natural language processing tasks using a convolutional neural network architecture includes receiving one or more inputs, generating one or more sets of filters conditioned on respective ones of the one or more inputs by implementing one or more encoders to encode the one or more inputs into one or more respective hidden vectors, and implementing one or more decoders to determine the one or more sets of filters based on the one or more hidden vectors, and performing adaptive convolution by applying the one or more sets of filters to respective ones of the one or more inputs to generate one or more representations.

20 Claims, 5 Drawing Sheets

(51) Int. Cl.
| | |
|---|---|
| *G06F 16/35* | (2019.01) |
| *G06N 3/08* | (2006.01) |
| *G06F 40/20* | (2020.01) |
| *H03M 7/30* | (2006.01) |
| *G06F 16/332* | (2019.01) |
| *G06F 16/33* | (2019.01) |
| *G06F 16/335* | (2019.01) |
| *H04L 12/58* | (2006.01) |

(52) U.S. Cl.
CPC ......... *G06F 16/3347* (2019.01); *G06F 16/35* (2019.01); *G06N 3/04* (2013.01); *G06N 3/0454* (2013.01); *G06N 3/08* (2013.01); *G06N 5/046* (2013.01); *H03M 7/6011* (2013.01); *H04L 51/22* (2013.01); *H03M 7/3082* (2013.01)

(58) Field of Classification Search
CPC ......... G06F 40/20; G06F 16/35; G06F 16/33; G06F 16/332; G06F 16/335; G06N 3/04; G06N 5/04; G06N 5/046; H03M 7/30; H03M 7/6011; H04L 12/58
See application file for complete search history.

(56) References Cited

U.S. PATENT DOCUMENTS

| | | | | |
|---|---|---|---|---|
| 2018/0018554 | A1* | 1/2018 | Young | G06N 3/02 |
| 2018/0075343 | A1* | 3/2018 | van den Oord | G06N 3/0472 |
| 2018/0082197 | A1* | 3/2018 | Aravamudan | G06N 5/04 |
| 2018/0129931 | A1* | 5/2018 | Bradbury | G06F 40/44 |
| 2018/0129937 | A1* | 5/2018 | Bradbury | G06N 3/04 |

OTHER PUBLICATIONS

Ma, Mingbo. "Convolutional Neural Network for Computer Vision and Natural Language Processing." (2015): i-28 (Year: 2015).*
Pu, Yunchen, et al. "Adaptive Feature Abstraction for Translating Video to Text." arXiv e-prints (Nov. 2016): arXiv-1611: 1-16 (Year: 2016).*
De Brabandere, Bert, et al. "Dynamic filter networks." arXiv preprint arXiv:1605.09673 (Jun. 2016): 1-14 (Year: 2016).*
Wang, Peng, et al. "Semantic expansion using word embedding clustering and convolutional neural network for improving short text classification." Neurocomputing 174 (2016): 806-814. (Year: 2016).*
Wang, Linnan, et al. "Accelerating deep neural network training with inconsistent stochastic gradient descent." Neural Networks 93 (Jun. 2017): 219-229. (Year: 2017).*
Shen, Dinghan, et al. "Learning context-sensitive convolutional filters for text processing." arXiv preprint arXiv:1709.08294 (Sep. 25, 2017) (Year: 2017).*
Pu, "Adaptive Feature Absliaction for Translating Video to Language", ICLR Workshop, Feb. 2017, pp. 1-4.
De Brabandere, "Dynamic Filter Networks", Neural Information Processing Systems, May 2016, pp. 1-9.
Shen, "Adaptive Convolutional Filter Generation for Natural Language Understanding", ArXiv, Sep. 2017, pp. 1-9.

* cited by examiner

CONVOLUTIONAL NEURAL NETWORK ARCHITECTURE WITH ADAPTIVE FILTERS

RELATED APPLICATION INFORMATION

This application claims priority to provisional application Ser. No. 62/556,534 filed on Sep. 11, 2017, which is incorporated herein by reference herein in its entirety.

This application is related to U.S. Pat. No. 10,635,858, which is incorporated herein by reference in its entirety.

BACKGROUND

Technical Field

The present invention relates to machine learning, and more particularly to convolutional neural network (CNN) architectures with adaptive filters.

Description of the Related Art

Artificial neural networks, referred to herein as neural networks, are machine learning systems that include a set of units or nodes ("neurons") organized in respective layers, which can include an input layer, an output layer and one or more optional hidden layers, for learning how to perform tasks. A variety of learning algorithms are known for implementing and training neural networks (e.g., backpropagation algorithms). Examples of tasks that can be performed by neural networks include, but are not limited to, natural language processing (NLP), image recognition, speech recognition, computer vision, medical diagnosis and computer data filtering. Examples of NLP tasks can include, but are not limited to, sentence/document classification, text sequence matching, language modeling, machine translation and abstractive sentence summarization.

SUMMARY

According to an aspect of the present invention, a system for employing input-conditioned filters to perform text categorization tasks using a convolutional neural network architecture is provided. The system includes a memory device for storing program code. The system also includes at least one processor, operatively coupled to the memory device. The at least one processor is configured to receive an input associated with one or more words, generate a set of filters conditioned on the input by implementing an encoder to encode the input into a hidden vector, and implementing a decoder to determine the set of filters based on the hidden vector, and perform adaptive convolution by applying the set of filters to the input to generate a representation corresponding to the input.

According to another aspect of the present invention, a system for employing input-conditioned filters to perform question-answering tasks using a convolutional neural network architecture is provided. The system includes a memory device for storing program code. The system also includes at least one processor, operatively coupled to the memory device. The at least one processor is configured to receive a first input associated with a question and a second input associated with an answer, generate a first set of filters conditioned on the first input and a second set of filters conditioned on the second input by implementing one or more encoders to encode the first input into a first hidden vector and the second input into a second hidden vector, and implementing one or more decoders to determine the first and second sets of filters based on the first and second hidden vectors, respectively, and perform adaptive convolution by applying the second set of filters to the first input to generate a first representation corresponding to the first input, and applying the first set of filters to the second input to generate a second representation corresponding to the second input.

According to yet another aspect of the present invention, a computer-implemented method for employing input-conditioned filters to perform natural language processing tasks using a convolutional neural network architecture is provided. The method includes receiving, by at least one processor operatively coupled to a memory, one or more inputs, generating, by the at least one processor, one or more sets of filters conditioned on respective ones of the one or more inputs by implementing one or more encoders to encode the one or more inputs into one or more respective hidden vectors, and implementing one or more decoders to determine the one or more sets of filters based on the one or more hidden vectors, and performing, by the at least one processor, adaptive convolution by applying the one or more sets of filters to respective ones of the one or more inputs to generate one or more representations.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
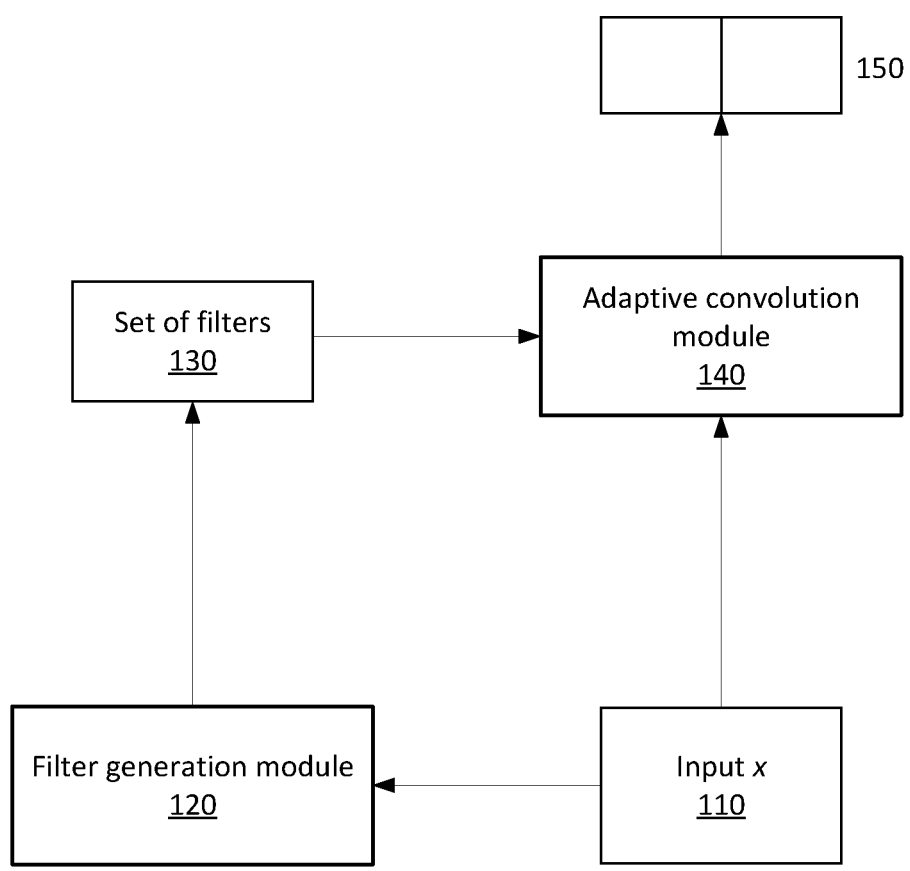
FIG. 1 is a block/flow diagram of a system/method for employing input-conditioned filters to perform text categorization tasks using a neural network architecture, in accordance with an embodiment of the present invention.

One example of a neural network is a convolutional neural network (CNN). CNNs are deep, feed-forward networks that, compared to other types of neural networks and methods, use relatively little pre-processing. This allows CNNs to learn filters that, in other architectures, are created or engineered using domain knowledge.

A CNN can include input and output layers, and can include multiple hidden layers. The hidden layers of a CNN can include one or more convolutional layers, one or more pooling layers (e.g., local and/or global pooling layers), one or more fully connected layers and/or one or more normalization layers. Convolutional layers apply a convolution operation to the input and pass the result to the next layer. Such convolution can emulate a neuronal response to an image. Pooling layers perform pooling to combine the outputs of neuron clusters of a layer as input into a subsequent layer. For example, max-pooling uses the maximum value from neuron clusters of a layer as input into the subsequent layer. As another example, average-pooling uses the average value from neuron clusters of a layer as input into the subsequent layer. Fully connected layers connect each neuron in a layer to each neuron in another layer.

CNN popularity mainly arises from: (1) the ability to extract salient and abstract features from every n-gram text fragment; (2) the flexibility of controlling effective context size by stacking several layers in a hierarchical manner; and (3) convolutions over different parts of a sequence are highly parallelable, and are thus more computationally efficient than, e.g., recurrent neural networks (RNNs).

The general idea of CNNs is the consideration of feature extraction and the corresponding supervised task in a joint manner. As an encoder network for text, CNNs can convolve an input, such as a sentence represented as an embedding matrix, with a set of filters with a window size of n, and thus can encapsulate meaningful semantic features from all n-gram phrases. An embedding matrix represents the mapping of words of a sentence, which can each corresponding to one dimension, to a vector space having a lower dimension.

However, in most cases, the weights of filters are assumed to be the same regardless of the input text or specific phrases. Although this filter type can capture the most common patterns inherent in natural language sentences, some vital features that are sample-specific may be neglected, especially in the case where conditional information is available. This observation is consistent with the intuition that while humans are reading different types of documents (e.g. academic papers or newspaper articles), humans tend to leverage distinct strategies for better and easier understanding. Additionally, in the context of selecting a correct answer to a question from a few candidates, it is natural for someone to read the answer (question) while simultaneously bearing the meaning of question (answer) in mind.

Existing CNN models may not be expressive enough, in the sense that different inputs can share a fixed set of filters. To increase the expressiveness and improve performance of CNNs to perform, e.g., NLP task(s), the embodiments described herein provide for an adaptive convolutional filter generation framework that leverages a meta-network to generate a set of input-aware filters. The convolution operation in the framework described herein does not have a fixed set of filters, thereby endowing the CNN with improved modeling flexibility and/or capacity. The set of input-aware filters generated by the meta-network described herein can be conditioned on an input, and can be adaptively applied to the same or a different text sequence. In this manner, the set of input-aware filters can vary from sentence-to-sentence and can allow more fine-grained feature abstraction. The filter-generating meta-networks described herein can be learned end-to-end together with other network modules during the training procedure. Moreover, since the flexibility of the framework described herein is inherent in the convolution operation, it can be naturally generalized to tackle NLP reasoning problems.

The framework in accordance with the embodiments described herein can be generalized to model sentence pairs. An adaptive question answering (AdaQA) model is described herein, where a two-way feature abstraction mechanism is introduced to encapsulate co-dependent sentence representations. The embodiments described herein can achieve state-of-the-art performance with respect to tasks including, e.g., document categorization and question answering tasks, achieving performance gains over strong CNN and non-CNN baselines. For example, the architecture in accordance with the embodiments described herein can generate highly effective filters for an input and can serve as a bridge to allow interactions between sentence pairs, without an excessive increase in the number of model parameters.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now in detail to the figures in which like numerals represent the same or similar elements and initially to FIG. 1, a block/flow diagram illustrates an exemplary adaptive convolutional neural network (ACNN) architecture 100.

An input 110 ("x") is provided. In one embodiment, the input 110 can include one or more words (e.g., a sentence). For example, the input 110 can be a review provided by a consumer, which can include one or more sentences corresponding to the review. The review could be of a product, hotel, restaurant, etc.

If the input 110 has a length T (padded where necessary), the words of the input 110 are $x_1, x_2, \ldots, x_T$, and the input 110 can be represented as a matrix $X \in \mathbb{R}^{d \times T}$ by concatenating the d-dimensional embeddings of all the words of the input 110 as columns.

Generally, in the convolutional layer(s) of a CNN architecture, a set of filters with weights $W \in \mathbb{R}^{K \times h \times d}$ is convolved with every window of h words within the sentence (e.g., $\{x_{1:h}, x_{2:h+1}, \ldots x_{T-h+1:T}\}$, where K is the number of output feature maps. In this manner, feature maps p for these h-gram text fragments can be generated as:

$$p_i = f(W \times x_{i:i+h-1} + b),$$

where $b \in \mathbb{R}^{d \times T}$ is the bias term and f is a non-linear function. For example, f can be implemented as a rectified linear unit (ReLU). The output feature maps of the convolutional layer(s), $p \in \mathbb{R}^{K \times (T-h+1)}$, can then be passed to the pooling layer(s) of the CNN. In one embodiment, the pooling layer(s) implement max-pooling, such that the maximum value in every row of p is taken to form a K-dimensional vector. By doing this, the most vital features detected by each filter can be kept and information from less fundamental text fragments can be removed. Moreover, max-pooling can guarantee that the size of the obtained representation is independent of the length of the sentence.

As shown in FIG. 1, the ACNN architecture 100 includes a filter generation module 120 and an adaptive convolution module 140. The filter generation module 120 generates a set of (fine-grained) filters 130 having filter(s) (f) with a specific size conditioned on the input 110, and the adaptive convolution module 140 applies the set of filters to an input (which can be the same or different from the input 110). The modules 120 and 140 are differentiable and the architecture 100 can be trained in an end-to-end manner. For example, in the context where the input 110 is a customer's product review, the filter generation module 120 can be adaptive for different categories of products and different types of customers by scanning the whole review.

In one embodiment, the filter generation module 120 utilizes an encoding-decoding framework to generate the set of filters 130. For example, the filter generation module 120 can include an encoder to encode the input 110 into a (fixed-length) hidden vector z (e.g., using a convolutional layer and a pooling layer), and a decoder that uses the hidden vector z to generate the set of filters 130 (e.g., using a deconvolutional layer). Since the dimension of the hidden vector z is independent of the length of the input 110, the set of filters 130 can have the same size and shape for every sentence. Accordingly, the encoding section of the filter generation module 120 abstracts information from the input 110 into the hidden vector z and, based on this representation, the decoding section of the filter generation module 120 determines the set of filters for the input 110.

As shown, the adaptive convolution module 140 receives as input the set of filters 130 from the filter generation module 120 and a sentence, and outputs a label 150 (y). For example, in the context where the input 110 is a consumer's review, the output 150 can include a numerical rating predicted based on the review associated with the input 110.

As shown in FIG. 1, the sentence is identical to the input 110 (e.g., the sentence used to generate the set of filters 130). However, in alternative embodiments (e.g., the architecture described below with reference to FIG. 2), the sentence can be different from the input 110 (e.g., different from the sentence used to generate the set of filters 130). Using the set of filters 130, the sentence received by the adaptive convolution module 140 (e.g., input 110) can be adaptively encoded via a CNN architecture including a convolutional layer and a pooling layer.

One application of the ACNN architecture described above with reference to FIG. 1 is text categorization, which aims to predict a label y for a given input x. The label y can be a topic, sentiment orientation, etc. To allow for strong modeling capacity, the generating process can be defined as the following encoding-decoding framework:

$$z = CNN(x, W_1)$$

$$f = DCNN(z, W_2)$$

where CNN is a convolutional layer of the filter generation module 120, DCNN is a deconvolutional layer of the filter generation module 120, and $W_1$ and $W_2$ are parameters to be learned in the convolutional layer and the deconvolutional layer, respectively. In this framework, the shape and the number of filters in the set of filters can be flexibly tuned by the parameter $W_2$ of the deconvolutional layer. After generating the set of filters, the set of filters are passed to the adaptive convolution module 140 with input x and output the corresponding sentence representation h, where h=CNN (x,f). The vector h is adopted for predicting the probabilities over each class, denoted as p, where p=softmax (Wh+b), where W and b are parameters of the classifier and softmax( ) is the softmax function. More specifically, W is a weight matrix connecting the hidden representation vector h and the output vector p, and b is a bias vector associated with output vector p. The parameters in DCNN, including W and b, can be learned by minimizing a task-specific loss function such as, e.g., cross-entropy loss.

Open-domain question answering aims to return an answer according to an input question. Considering the ability of the ACNN framework of FIG. 1 to generate a set of filters while being aware of a specific input, the concepts of the ACNN framework of FIG. 1 can be naturally applied to question answering applications.

Generally, the goal of question answering is to identify a correct answer from a set of candidates in response to a factual question. For example, given a question q, q can be associated with a set or list of candidate answers $\{a_1, a_2, \ldots, a_m\}$ and their corresponding labels $\{y_1, y_2, \ldots, y_m\}$. For i=1, 2, ..., m, if $a_i$ correctly answers q, then $y_i=1$ and otherwise $y_i=0$. Accordingly, the question answering task can be cast as a classification problem where, given an unlabeled question-answer pair $(q_i, a_i)$, a label $y_i$ is predicted.

Figure 2:
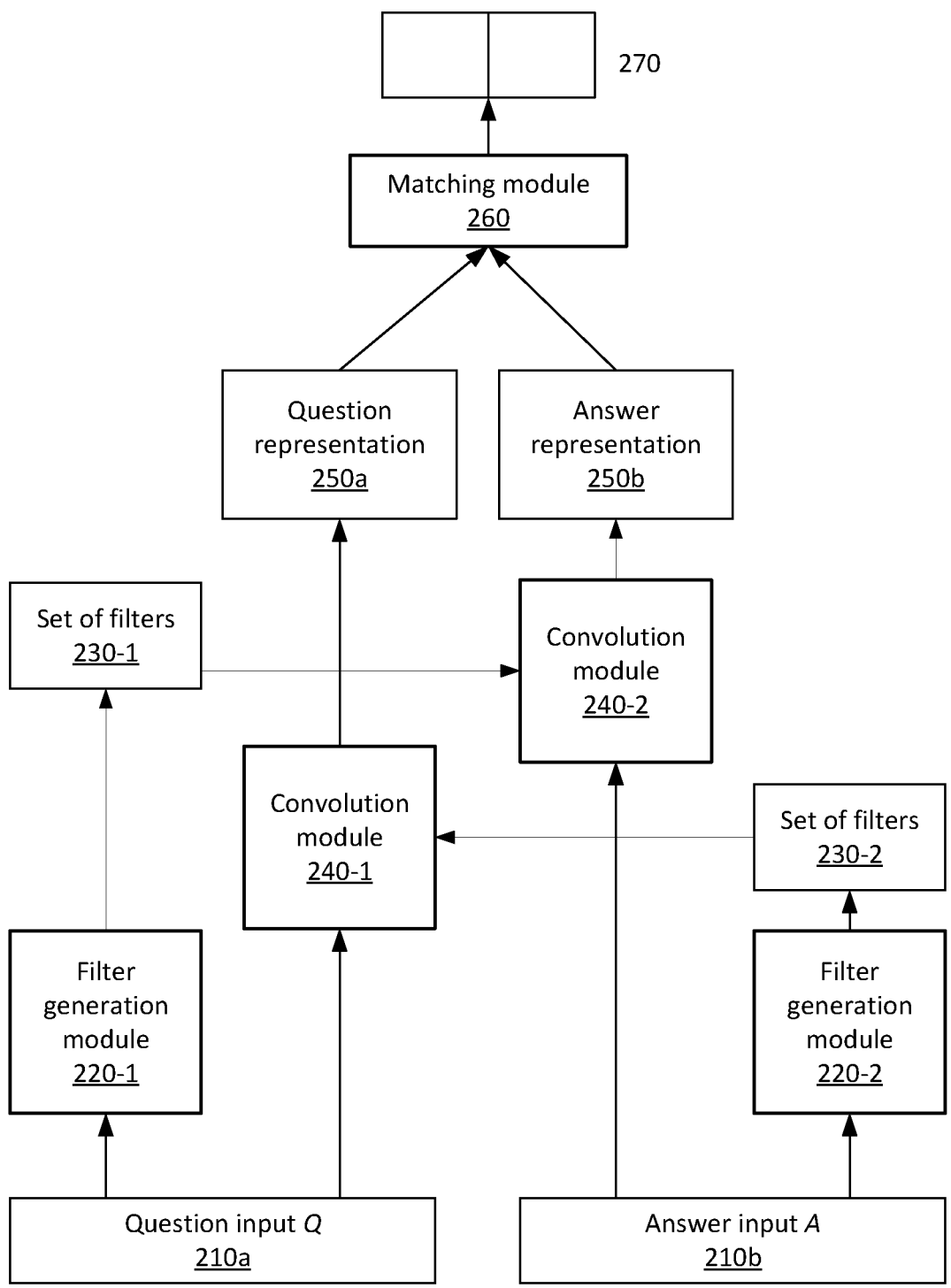
FIG. 2 is a block/flow diagram of a system/method for employing input-conditioned filters to perform question-answering tasks using a neural network architecture, in accordance with another embodiment of the present invention.

Referring now to FIG. 2, a block/flow diagram is provided illustrating an exemplary adaptive question answering (AdaQA) architecture 200. As shown, a question-answer pair including a question input Q 210a and an answer input A 210b is provided. The question and answer inputs 210a and 210b can be represented by their word embedding matrices. For example, $Q \in \mathbb{R}^{d \times T_1}$ and $A \in \mathbb{R}^{d \times T_2}$.

The question input 210a is passed to filter generation module 220-1 and the answer input 210b is passed to filter generation module 220-2 to generate set of filters 230-1 for the question input and set of filters 230-2 for the answer input. Similar to the filter generation module 120 describe above, the sets of filters 230-1 and 230-2 can each be generated by their corresponding filter generation modules 220-1 and 220-2 by employing an encoding-decoding framework. For example, for a question q, the process to generate the set of filters 230-1, $f_q$, can be defined as:

$$z_q = CNN(Q, W_3)$$

$$f_q = DCNN(z_q, W_4)$$

where CNN is a convolutional layer of the filter generation module 220-1, DCNN is a deconvolutional layer of the filter generation module 220-1, and $W_3$ and $W_4$ are parameters to be learned in the convolutional layer and the deconvolutional layer, respectively. A similar process can be utilized to generate the set of filters 230-2, $f_a$.

As further shown, adaptive convolution module 240-1 receives the set of filters 230-2 and the answer input 210b (e.g., A), and adaptive convolution module 240-2 receives the set of filters 230-1 and the question input 210a (e.g., Q). The adaptive convolution module 240-1 generates a question representation 250a, and the adaptive convolution module 240-2 generates an answer representation 250b. This is done to abstract information from the answer/question pertinent to the corresponding question/answer, such that the most important features for relatedness prediction are selectively encapsulated, and less vital information is filtered out.

The question representation 250a can include a matrix. The adaptive convolution module 240-1 can perform the following operation to generate the question representation 250a, $h_q$: $h_q = CNN(Q, f_a)$. That is, the question embedding matrix Q can be convolved with the set of filters 230-2 to generate the question representation 250a.

The answer representation 250b can include a matrix. The adaptive convolution module 240-2 can perform the following operation to generate the answer embedding matrix

250b, $h_a$: $h_a$=CNN (A, $f_q$). That is, the answer embedding matrix A is convolved with the set of filters 230-1 to generate the answer representation 250b.

The question and answer representations 250a and 250b are received by matching module 260 to implement a matching function. In one embodiment, the matching function defines a vector t as follows:

$$t=[h_q;h_a;h_q-h_a;h_q \circ h_a],$$

where − and ∘ denote element-wise subtraction and element-wise product operations, respectively, [a;b] is concatenation as column vectors. Then, t is used to model a conditional probability distribution, $p(y=1|h_q, h_a)$. For example, the conditional probability distribution can be modeled as follows:

$$p(y=1|h_q,h_a)=\sigma(W't+b'),$$

where σ( ) is the sigmoid function. An output (e.g., prediction) y 270 is output by the matching module 260.

Notably, the weights of the filter generating networks for both the answer and answer are shared so that the model adaptivity for answer selection can be improved without an excessive increase in the number of parameters. Accordingly, the modules in the architecture of FIG. 2 can be jointly trained in an end-to-end manner.

The architecture 200 is designed for solving a question-answering task (e.g., answer selection given a question). For example, the architecture 200 can be implemented within an automatic online help desk system, where question input 210a can be a technical question posted by a consumer about the functionality of a product, and the answer input 210b can be a page from a list of technical guide pages. Accordingly, the architecture 200 can be applied to select the right page from the list of technical guide pages to answer given the consumer's question.

Figure 3:
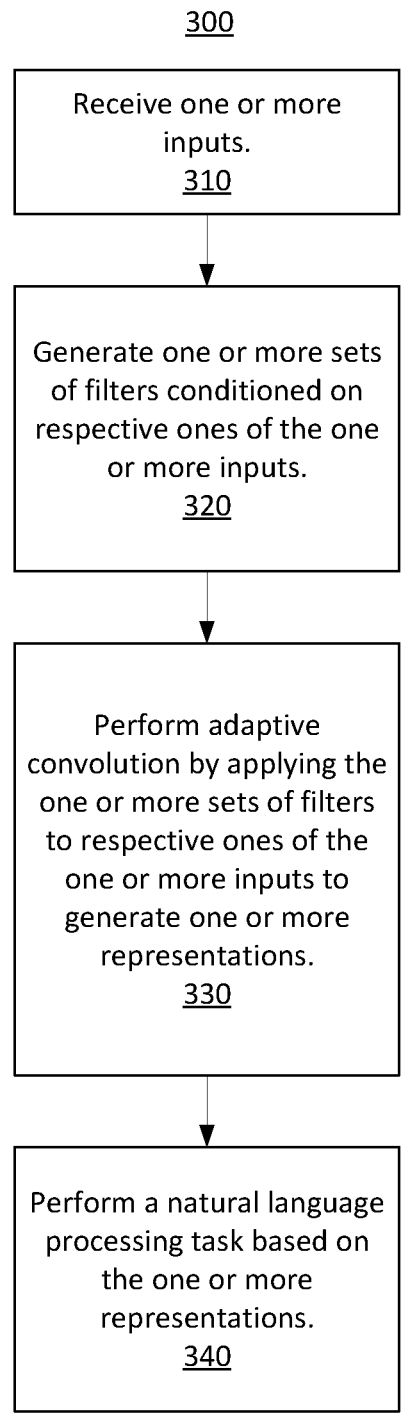
FIG. 3 is a block/flow diagram of a system/method for employing input-conditioned filters to perform machine learning tasks using a neural network architecture, in accordance with embodiments of the present invention.

Referring now to FIG. 3, a block/flow diagram is provided illustrating an overview of a system/method 300 for employing input-conditioned filters to perform machine learning tasks using a neural network architecture. In one embodiment, the system/method 300 is performed in the context of a natural language processing task. For example, the system/method 300 can perform, e.g., text categorization tasks, question-answering tasks, etc. In one embodiment, the neural network architecture includes a CNN architecture.

At block 310, one or more inputs are received. The one or more inputs can be associated with one or more words. In one embodiment, the one or more inputs can include a matrix representing the one or more words. In another embodiment, the one or more inputs can include a first input associated with a question and a second input associated with an answer. For example, the first input can include a question embedding matrix and the second input can include an answer embedding matrix.

At block 320, one or more sets of filters conditioned on respective ones of the one or more inputs are generated. The one or more sets of filters can be generated by implementing one or more encoders to encode the one or more inputs into one or more respective vectors (e.g., using one or more first parameters), and implementing one or more decoders to determine the one or more sets of filters based on the one or more hidden vectors (e.g., using one or more second parameters). The one or more encoders can each include a convolutional layer, and the one more decoders can each include a deconvolutional layer.

For example, in the embodiment where the one or more inputs include a first input associated with a question and a second input associated with an answer, a first set of filters conditioned on the first input can be generated by implementing an encoder to encode the first input into a first hidden vector and a decoder to determine the first set of filters based on the first hidden vector, and a second set of vectors conditioned on the second input can be generated by implementing an encoder to encode the second input into a second hidden vector and a decoder to determine the second set of filters based on the second hidden vector.

At block 330, adaptive convolution is performed by applying the one or more sets of filters to respective ones of the one or more inputs to generate one or more representations. Applying each of the one or more sets of filters to the corresponding input s to generate the one or more representations can include applying one or more convolutional layers.

For example, in the embodiment where the one or more inputs include a first input associated with a question and a second input associated with an answer, a first representation corresponding to the first input can be generated by applying the second set of filters to the first input, and a second representation corresponding to the second input can be generated by applying the first set of filters to the second input.

At block 340, a natural language processing task is performed based on the one or more representations.

For example, the natural language task can include a text categorization task. Performing a text categorization task based on a given representation can include predicting a probability over a class based on the representation, and outputting a label based on the probability. The label can include, e.g., a topic, sentiment orientation, etc.

As another example, in the embodiment where the one or more inputs include a first input associated with a question and a second input associated with an answer, the natural language task can include a question-answering task. Performing the question-answering task based on the first and second inputs can include generating a matching vector based on the first and second representations, modeling a conditional probability distribution based on the matching vector, and outputting a label based on the conditional probability distribution. The matching vector can be generated by implementing a matching function. The conditional probability distribution can be modeled by implementing the sigmoid function σ( ).

Further details regarding each of the blocks described with reference to FIG. 3 are described above with reference to FIGS. 1 and 2.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Figure 4:
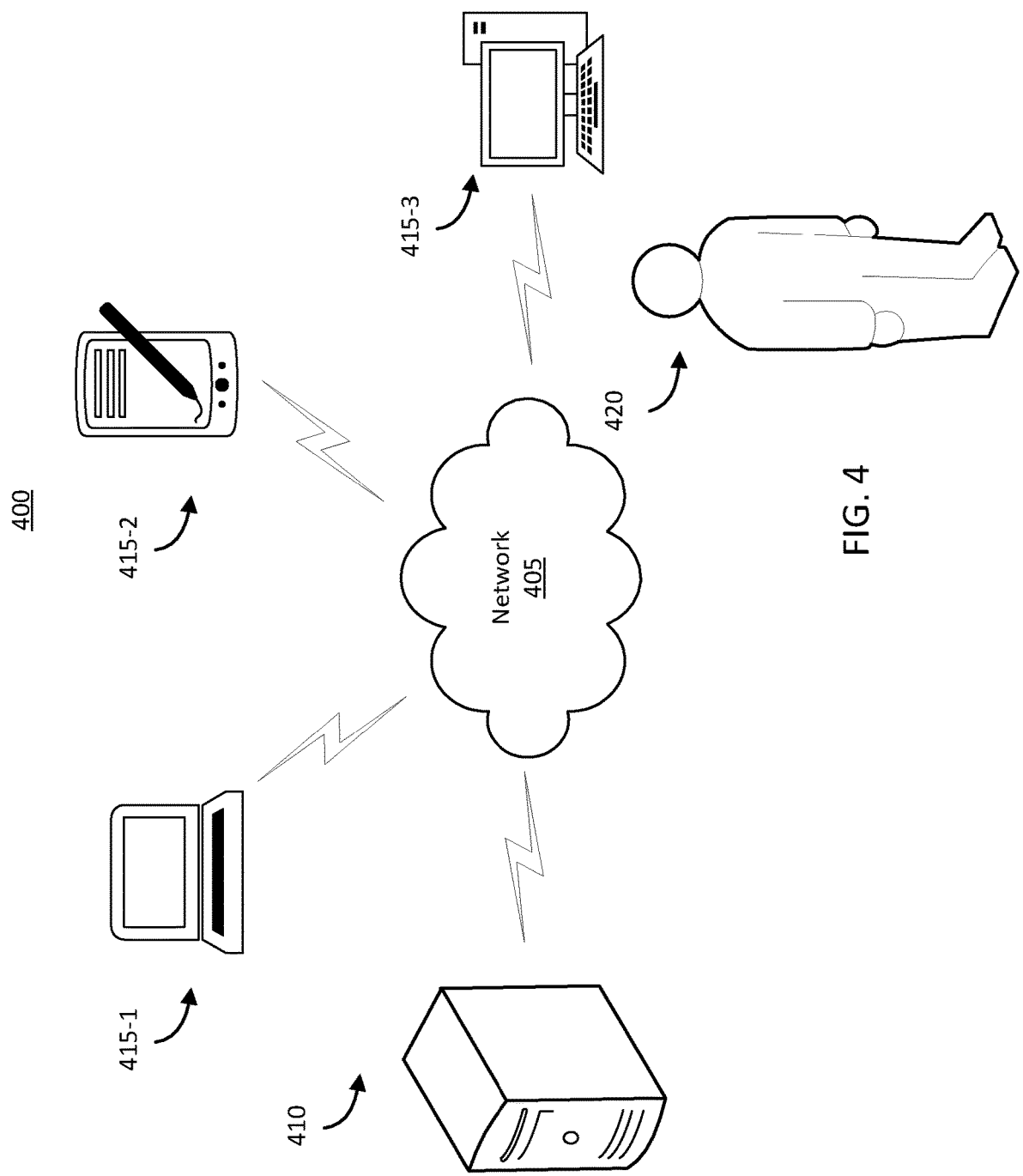
FIG. 4 is a block diagram of an exemplary environment to which the present invention can be applied, in accordance with an embodiment of the present invention.

FIG. 4 shows a block diagram of an exemplary environment 400 to which one or more of the embodiments described herein can be applied, in accordance with an embodiment of the present invention. The environment 400 is representative of a computer network. The elements shown relative to FIG. 4 are set forth for the sake of illustration. However, it is to be appreciated that the embodiments described herein can be applied to other network configurations and other operational environments as readily contemplated by one of ordinary skill in the art given the teachings of the embodiments described herein.

The environment 400 at least includes at least one computer processing system 410 and one or more computing devices connected to a network 405. In this illustrative embodiment, the one or more computing devices include computing devices 415-1, 415-2 and 415-3. However, the number of computing devices should not be considered limiting.

The computer processing system 410 can include any type of computer processing system including, but not limited to, servers, desktops, laptops, tablets, personal digital assistants (PDAs) smart phones, media playback devices, and so forth, depending upon the particular implementation. For the sake of illustration, the computer processing system 410 is a server.

The computing devices 415-1 through 415-3 can include any type of computing device including, but not limited to, servers, desktops, laptops, tablets, PDAs, smart phones, media playback devices, and so forth, depending upon the particular implementation. For the sake of illustration, the computing processing device 415-1 is a laptop, the computing device 415-2 is a smartphone or a PDA, and the computing device 415-3 is a desktop.

The computer processing system 410 is configured to receive one or more inputs associated with one or more e-mails corresponding to one or more users, such as user 420, across the at least one network 405, classify the one or more e-mails by performing natural language processing based on one or more sets of filters conditioned on respective ones of the one or more inputs, and permit the user 420 to access to the one or more classified e-mails via the one or more computing devices 415-1 through 415-3 (e.g., via an Internet browser and/or an electronic mail application ("app"). For example, the computer processing system 410 can automatically perform one or more classification operations on the one or more electronic message based on text content of the one or more electronic messages. Types of classification operations include, but are not limited to, determining whether the one or more electronic messages are unsolicited (e.g., spam or junk), assigning the one or more electronic messages to one or more folders (e.g., assigning an electronic message to a spam or junk folder), and assigning one or more tags to the one or more electronic messages.

The computer processing system 410 can implement machine learning techniques, such as the text classification techniques described herein, to perform the one or more classification operations. For example, in the context of determining whether a given electronic message is unsolicited, the text classification techniques described herein can be used to learn what text content is likely to be associated with an unsolicited electronic message, and to determine a likelihood that the given electronic message is an unsolicited electronic message. In one embodiment, the computer processing system 410 can compare the likelihood to a threshold, and determine that the given electronic message is an unsolicited electronic message if the likelihood exceeds a threshold. The threshold can be associated with a "sensitivity" of the unsolicited electronic message filter, such that a higher threshold can correspond to a less sensitive unsolicited electronic message filter, and a lower threshold can correspond to a more sensitive unsolicited electronic message filter.

In the embodiment shown in FIG. 4, the elements thereof are interconnected by at least one network 405. However, in other embodiments, other types of connections (e.g., wired, etc.) can also be used. Additionally, one or more elements in FIG. 4 may be implemented by a variety of devices, which include but are not limited to, Digital Signal Processing (DSP) circuits, programmable processors, Application Specific Integrated Circuits (ASICs), Field Programmable Gate Arrays (FPGAs), Complex Programmable Logic Devices (CPLDs), and so forth. These and other variations of the elements of environment 500 can be readily determined by one of ordinary skill in the art.

Further details regarding the implementation of the electronic message classification and delivery system and method describe in FIG. 4 are described above with reference to FIGS. 1-3.

Figure 5:
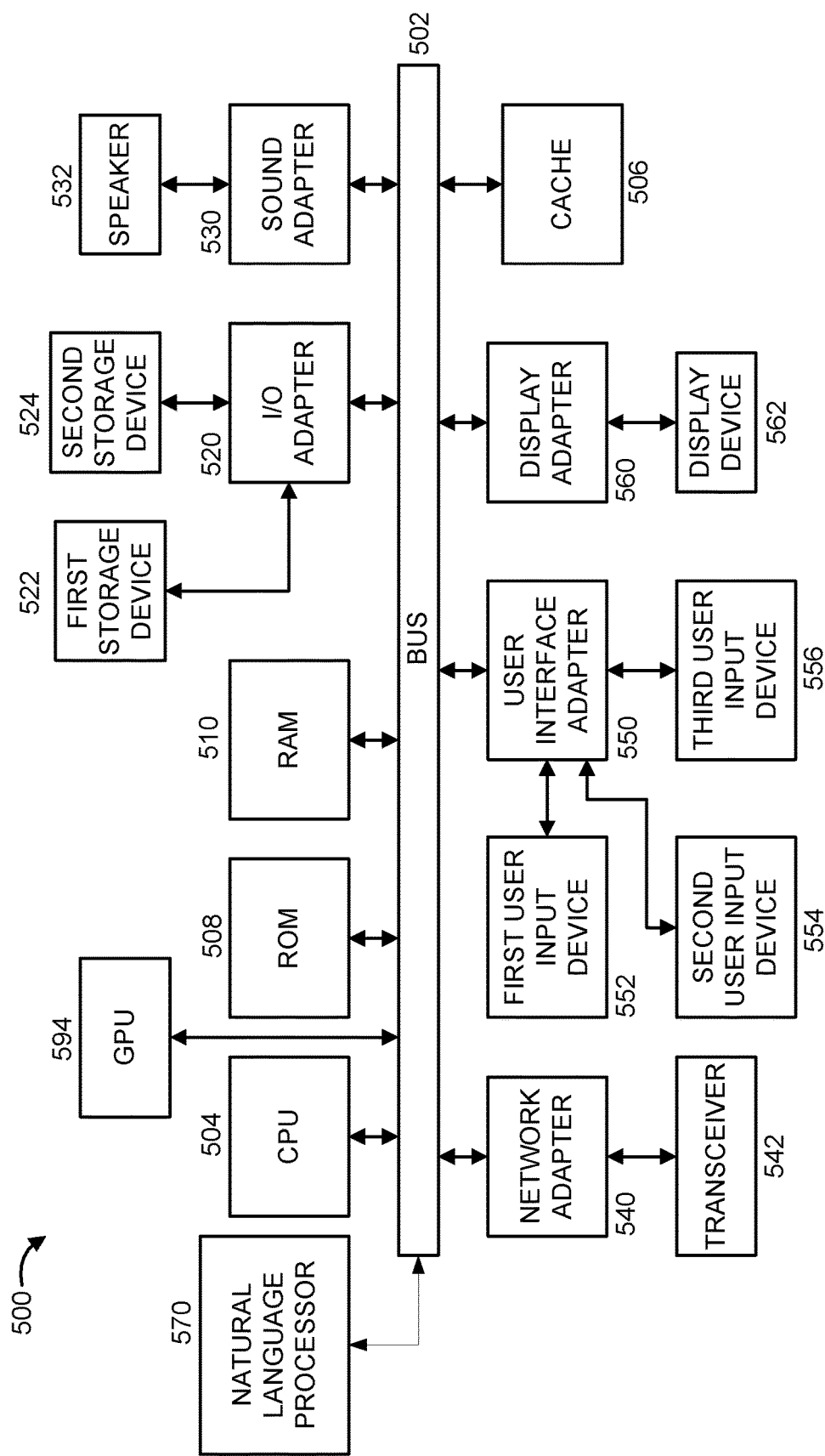
FIG. 5 is a block diagram of a processing system in accordance with an embodiment of the present invention.

Referring now to FIG. 5, an exemplary processing system 500 is shown which may implementing the embodiments described with reference to FIGS. 1-4. The processing system 500 includes at least one processor (CPU) 504 operatively coupled to other components via a system bus 502. A cache 506, a Read Only Memory (ROM) 508, a Random Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 can be any of a disk storage device (e.g., a magnetic or optical disk storage device), a solid state magnetic device, and so forth. The storage devices 522 and 524 can be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 552, 554, and 556 can be the same type of user input device or different types of user input devices. The user input devices 552, 554, and 556 are used to input and output information to and from system 500.

Natural language processor 570 may be operatively coupled to system bus 502. Natural language processor 570 is configured to perform one or more of the operations described above with reference to FIGS. 1-4. Natural language processor 570 can be implemented as a standalone special purpose hardware device, or may be implemented as software stored on a storage device. In the embodiment in which natural language processor 570 is software-implemented, although shown as a separate component of the computer system 500, natural language processor 570 can be stored on, e.g., the first storage device 522 and/or the second storage device 529. Alternatively, natural language processor 570 can be stored on a separate storage device (not shown).

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present principles provided herein.

Having described preferred embodiments of systems and methods for a convolutional neural network architecture with adaptive filters (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A system for employing input-conditioned filters to perform text categorization tasks using a convolutional neural network architecture, comprising:
    a memory device for storing program code; and
    at least one processor operatively coupled to the memory device and configured to execute program code stored on the memory device to:
    receive an input associated with one or more words;
    generate a set of input-aware filters conditioned on the input by implementing an encoder to encode the input into a hidden vector, and implementing a decoder to determine the set of filters based on the hidden vector, the input-aware filters being generated by an adaptive convolutional filter generation framework that uses a meta-network to generate the input-aware filters, with the set of input-aware filters being conditioned on an input sentence and being adaptively applied to text sequences, such that the set of input-aware filters is variable from input sentence-to-sentence; and
    perform adaptive convolution by applying the set of input-aware filters to the input to generate a representation corresponding to the input.

2. The system of claim 1, wherein the input includes a matrix representing the one or more words.

3. The system of claim 1, wherein the encoder includes a convolutional layer, and the decoder includes a deconvolutional layer.

4. The system of claim 1, wherein the at least one processor is configured to generate the representation by applying a convolutional layer.

5. The system of claim 1, wherein the at least one processor is further configured to perform a text categorization task based on the representation by:
    predicting a probability over a class based on the representation; and
    outputting a label based on the probability.

6. A system for employing input-conditioned filters to perform question-answering tasks using a convolutional neural network architecture, comprising:
    a memory device for storing program code; and
    at least one processor operatively coupled to the memory device and configured to execute program code stored on the memory device to:
    receive a first input associated with a question and a second input associated with an answer;
    generate a first set of input-aware filters conditioned on the first input and a second set of input-aware filters conditioned on the second input by implementing one or more encoders to encode the first input into a first hidden vector and the second input into a second hidden vector, and implementing one or more decoders to determine the first and second sets of filters based on the first and second hidden vectors, respectively, the first and second sets of input-aware filters being generated by an adaptive convolutional filter generation framework that uses a meta-network to generate the input-aware filters, with the first and second sets of input aware filters being conditioned on input sentences and being adaptively applied to text sentences, such that the first and second sets of input-aware filters are variable from input sentence-to-sentence; and
    perform adaptive convolution by applying the second set of input-aware filters to the first input to generate a first representation corresponding to the first input, and applying the first set of input-aware filters to the second input to generate a second representation corresponding to the second input.

7. The system of claim 6, wherein the first input includes a question embedding matrix and the second input includes an answer embedding matrix.

8. The system of claim 6, wherein the one or more encoders each include a convolutional layer, and the one or more decoders each include a deconvolutional layer.

9. The system of claim 6, wherein the at least one processor is configured to apply the first and second sets of filters to generate the first and second representations by applying convolutional layers.

10. The system of claim 6, wherein the at least one processor is further configured to perform a question-answering task based on the first and second representations.

11. The system of claim 10, wherein the at least one processor is further configured to perform the question-answering task by:
    generating a matching vector based on the first and second representations;
    modeling a conditional probability distribution based on the matching vector; and
    outputting a label based on the conditional probability distribution.

12. A computer-implemented method for employing input-conditioned filters to perform natural language processing tasks using a convolutional neural network architecture, comprising:
    receiving, by at least one processor operatively coupled to a memory, one or more inputs;

generating, by the at least one processor, one or more sets of input-aware filters conditioned on respective ones of the one or more inputs by implementing one or more encoders to encode the one or more inputs into one or more respective hidden vectors, and implementing one or more decoders to determine the one or more sets of input-aware filters based on the one or more hidden vectors, the one or more sets of input-aware filters being generated by an adaptive convolutional filter generation framework that uses a meta-network to generate the input-aware filters, with the set of input-aware filters being conditioned on an input sentence and being adaptively applied to text sequences, such that the one or more sets of input-aware filters is variable from input sentence-to-sentence; and performing, by the at least one processor, adaptive convolution by applying the one or more sets of input-aware filters to respective ones of the one or more inputs to generate one or more representations.

13. The method of claim 12, wherein the one or more encoders each include a convolutional layer, and the one more decoders each include a deconvolutional layer.

14. The method of claim 12, wherein applying the one or more sets of input-aware filters to respective ones of the one or more inputs to generate the one or more representations further includes applying one or more convolutional layers.

15. The method of claim 12, wherein each of the one or more inputs includes a matrix representing one or more words.

16. The method of claim 15, further comprising performing, by the at least one processor, a text categorization task based on the one or more representations, including:
predicting one or more probabilities over one or more respective classes based on the one or more representations; and
outputting one or more labels based on the one or more probabilities.

17. The method of claim 12, wherein the one or more inputs include a first input associated with a question and a second input associated with an answer, and wherein the one or more sets of input-aware filters include a first set of filters corresponding to the first input and a second set of filters corresponding to the second input.

18. The method of claim 17, wherein the first input includes a question embedding matrix and the second input includes an answer embedding matrix.

19. The method of claim 17, wherein the one or more representations include a first representation corresponding to the first input and a second representation corresponding to the second input.

20. The method of claim 19, further comprising performing, by the at least one processor, a question-answering task based on the first and second representations, including:
generating a matching vector based on the first and second representations;
modeling a conditional probability distribution based on the matching vector; and
outputting a label based on the conditional probability distribution.

* * * * *